(12) United States Patent
Li et al.

(10) Patent No.: US 10,445,008 B2
(45) Date of Patent: Oct. 15, 2019

(54) DATA MANAGEMENT METHOD FOR MEMORY AND MEMORY APPARATUS

(71) Applicant: MACRONIX INTERNATIONAL CO., LTD., Hsinchu (TW)

(72) Inventors: Yung-Chun Li, New Taipei (TW); Ping-Hsien Lin, Taipei (TW); Yu-Ming Chang, Pingtung County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/705,309

(22) Filed: Sep. 15, 2017

(65) Prior Publication Data

US 2019/0087110 A1    Mar. 21, 2019

(51) Int. Cl.

| G06F 12/00 | (2006.01) |
| G06F 3/06 | (2006.01) |
| G11C 11/56 | (2006.01) |
| G11C 16/08 | (2006.01) |
| G11C 16/10 | (2006.01) |
| G11C 16/34 | (2006.01) |
| G06F 13/00 | (2006.01) |
| G06F 13/28 | (2006.01) |

(52) U.S. Cl.
CPC ........... *G06F 3/0625* (2013.01); *G06F 3/0634* (2013.01); *G06F 3/0655* (2013.01); *G06F 3/0688* (2013.01); *G11C 11/5628* (2013.01); *G11C 16/08* (2013.01); *G11C 16/10* (2013.01); *G11C 16/3418* (2013.01)

(58) Field of Classification Search
CPC ..... G06F 3/0688; G06F 3/0634; G06F 3/0655
See application file for complete search history.

(56) References Cited

U.S. PATENT DOCUMENTS

| 8,130,554 | B1 | 3/2012 | Linnell | |
| 8,909,888 | B2 | 12/2014 | Goss et al. | |
| 9,436,594 | B2* | 9/2016 | Hars | .................. G06F 12/0246 |
| 9,471,232 | B2 | 10/2016 | Koren et al. | |
| 2004/0188710 | A1* | 9/2004 | Koren | .................. G11C 16/102 |
| | | | | 257/197 |
| 2007/0002629 | A1* | 1/2007 | Lee | ......................... G11C 8/08 |
| | | | | 365/185.19 |
| 2008/0059692 | A1* | 3/2008 | Erez | ..................... G06F 12/0246 |
| | | | | 711/103 |

(Continued)

*Primary Examiner* — Mark A Giardino, Jr.
(74) *Attorney, Agent, or Firm* — McClure, Qualey & Rodack, LLP

(57) ABSTRACT

A data management method for memory and a memory apparatus are provided. The memory includes a number of memory pages. Each of the memory pages includes multiple memory cells. Each of the memory cells includes a first bit and a second bit. Each of the memory cells has a first logical state, a second logical state, a third logical state, and a fourth logical state. The data management method for memory includes the following steps. A data update command corresponding to a logical address is received. The logical address corresponds to a physical address before receiving the data update command. A sanitizing voltage is applied to a first target memory cell of the memory cells in a target memory page of the memory pages located at the physical address. The logical state of the first target memory cell is changed.

14 Claims, 8 Drawing Sheets

(56) References Cited

U.S. PATENT DOCUMENTS

| | | | |
|---|---|---|---|
| 2013/0139035 A1* | 5/2013 | Zhong | G11C 11/5642 |
| | | | 714/773 |
| 2014/0321210 A1* | 10/2014 | Xiang | G11C 16/04 |
| | | | 365/185.18 |
| 2016/0034217 A1 | 2/2016 | Kim et al. | |
| 2016/0132253 A1 | 5/2016 | Chiu | |

* cited by examiner

US 10,445,008 B2

DATA MANAGEMENT METHOD FOR MEMORY AND MEMORY APPARATUS

FIELD OF THE INVENTION

The invention relates to a data management method for a memory and a memory apparatus.

BACKGROUND OF THE INVENTION

In recent years, flash-based storage gradually replaces traditional hard disks to be storage of consumer electronics. Compared to hard disks, flash-based storage has some advantages, such as better performance, lower energy consumption, shock resistance, and compact size.

However, flash-based storage differs from hard disk in characteristic of out-of-place update, which the page cannot be re-written before erase operation in flash technology. When a user would like to update data which has written into a page of the flash-based storage, the user needs to write the updated data to a new blank page and the logical address is re-mapped to the new page to complete the data update.

In other words, when the written data needs to be updated, a new copy of the data is written (programmed) into a new blank page, and the logical address is re-mapped to this new page. Due to the aforementioned, one or more copies are generated and left in the flash-based storage after updating data.

The flash-based storage cannot directly erase the pages having those copies. Hackers could use those copies to rebuild data, and this is a hidden risk of data security. In addition, a method of erasing memory blocks after garbage collection would degrade the performance of the flash-based storage and shorten the lifetime of the flash-based storage. Therefore, there is a need to provide a data management method for a memory and a memory apparatus to remove data copies when the user updates a data.

SUMMARY OF THE INVENTION

The invention is directed to a data management method for memory and a memory apparatus. The logical state of the memory cells of the memory blocks could be changed by applying voltage. Accordingly, the data stored in the memory cells could be changed and the data could not be read correctly. Thus, the purpose of "deleting" data is achieved. The data security of memory could be improved and the hackers would not get data copies to rebuild data. The number of erasing memory blocks could be reduced, the lifetime of the memory could be extended, and the usage performance of the memory could be increased. When reading page, the number of applying reading voltage could be decreased, and thus the performance of the memory could be improved.

According to one aspect of the present invention, a data management method for a memory is provided. In Multi-Level Cell (MLC) memory, the memory includes a plurality of memory pages. Each of the memory pages includes a plurality of memory cells. Each of the memory cells includes a first storage bit and a second storage bit. Each of the memory cells has a first logical state, a second logical state, a third logical state, and a fourth logical state. The data management includes the following steps. A data update command corresponding to a logical address is received. The logical address maps to a physical address before receiving the data update command. A sanitizing voltage is applied to a first target memory cell of the memory cells in a target memory page of the memory pages located at the physical address to change the logical state of the first target memory cell.

According to another aspect of the present invention, a memory apparatus is provided. The memory apparatus comprises a memory array and a sanitizer. The memory array includes a plurality of memory pages. Each of the memory pages includes a plurality of memory cells. Each of the memory cells includes a first storage bit and a second storage bit. Each of the memory cells has a first logical state, a second logical state, a third logical state, and a fourth logical state. The sanitizer is used for receiving a data update command corresponding to a logical address. The logical address maps to a physical address before receiving the data update command. The sanitizer applies a sanitizing voltage to a first target cell of the memory cells in a target memory page of the memory pages located at the physical address to change the logical state of the first target memory cell.

The above and other aspects of the invention will become better understood with regard to the following detailed description of the preferred but non-limiting embodiment(s). The following description is made with reference to the accompanying drawings.

Figure 1:
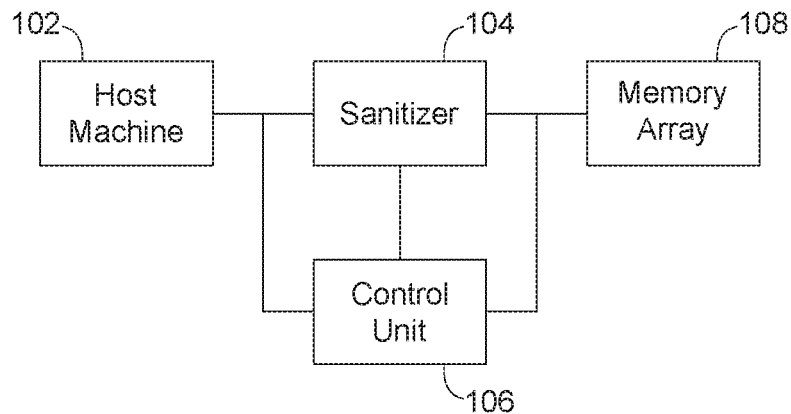
FIG. 1 shows a diagram illustrating a memory system according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION OF THE INVENTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 2:
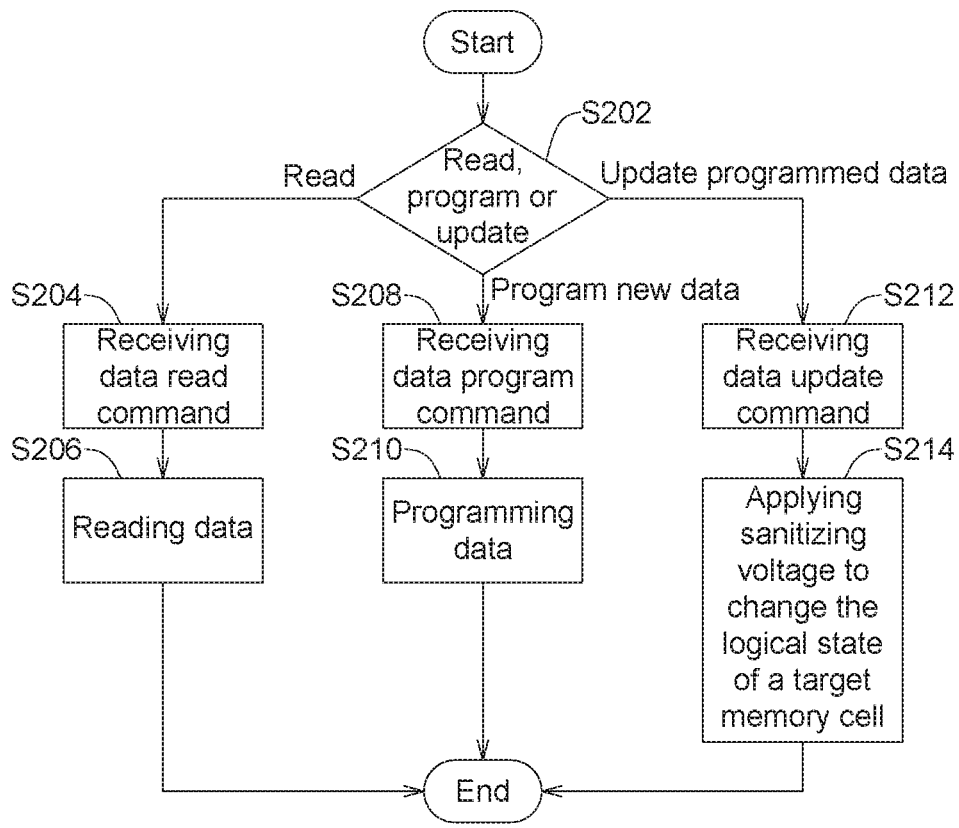
FIG. 2 illustrates a flow diagram for a data management method for a memory according to one embodiment of this disclosure.

Please refer to FIGS. 1 and 2. FIG. 1 shows a diagram illustrating a memory system 10 according to one embodiment of the present disclosure. FIG. 2 illustrates a flow diagram for a data management method for a memory according to one embodiment of this disclosure. The memory system 10 includes a host machine 102, a sanitizer 104, a control unit 106, and a memory array 108. The host machine 102 is used to transmit read commands, write (program) commands, erase commands, or data update commands to the control unit 106. The sanitizer 104 is used to performing the data management method of this invention. The memory array 108 could be, for example, NAND flash memory or any other type of flash memory or storage device. The memory array 108 includes a plurality of memory blocks. Each of the memory blocks includes a plurality of memory pages, and each of the memory pages includes a plurality of memory cells. The host machine 102, the sanitizer 104 and the control unit 106 could be, for example, implemented by a chip, a circuit block in the chip, a firmware circuit, a circuit board having several electronic elements and wires, or a storage medium storing a number of program codes, and could also be implemented by performing a corresponding software, firmware or program using an electronic apparatus, such as a computer system, electronic devices, embedded system, handhold devices, or a server.

At step S202, the control unit 106 determines the command transmitted from the host machine 102 is to read data, write (program) new data or update programmed data. When the command transmitted from the host machine 102 is to read data, at step S204, the control unit 106 receives a data read command, and then at step S206, the control unit 106 reads the data stored in the memory array 108.

When the command transmitted from the host machine 102 is to write (program) new data, at step S208, the control unit 106 receives a data program command. At step S210, the control unit 106 programs the new data into the memory array 108. The new data mentioned above means that the new data has not been stored in the memory array 108, and the Flash Translation Layer (FTL) cannot find any memory block corresponding to the new data, that is, no copies of the new data are stored in the memory array 108.

When the command transmitted from the host machine 102 is to update programmed data, at step S212, the control unit 106 receives a data update command corresponding to a logical address, and the sanitizer 104 also receives the data update command corresponding to the logical address to update data. The Flash Translation Layer has recorded a mapping relationship between a logical address and a physical address of a memory page where programmed data is stored. Thus, the logical address maps to a physical address before receiving the data update command. At step S214, the memory page where the programmed data is stored is taken as a target memory page, and the sanitizer 104 applies a sanitizing voltage to the target memory page of the memory array 108 to change the logical state of a target memory cell of the memory cells of the target memory page. Changing the logical state of the target memory cell of the memory cells in the target memory page of the memory pages is equivalent re-programming the target memory cell to change the data of the target memory cell. A similar effect as deleting data is achieved. Thus, hackers cannot use data copies to rebuild data. In this invention, "sanitize" and "sanitization" mean that the logical state of a target memory cell of a target memory page is changed and the target memory cell is re-programmed to change data stored into the target memory cell, and thus a similar effect as "deleting" data is achieved.

Please refer to FIGS. 3 to 10. FIGS. 3 to 10 show diagrams illustrating sanitization for multi-level cells (MLC) according to embodiments of this disclosure. FIGS. 3 to 10 further illustrate how the logical state of the target memory cell of the target memory page of the target memory block is changed by applying a sanitizing voltage.

Memory blocks 30, 40, 50, 60, 70, 80, 90, and 100 in FIGS. 3 to 10 have the same or similar configuration. Each of memory blocks 30, 40, 50, 60, 70, 80, 90, and 100 includes a plurality of word lines, and a word line includes a first page and a second page. A page could include more than one memory cells. The memory cell of each of memory blocks 30, 40, 50, 60, 70, 80, 90, and 100 is a multi-level cell including a first storage bit and a second storage bit to store two bits. Storing the data of two pages in a word line is equivalent to storing two-bit data in each cell of the same word line. Each of the memory cells has a first logical state, a second logical state, a third logical state, and a fourth logical state. For example, the first logical state is "11", the second logical state is "10", the third logical state is "00", and the fourth logical state is "01." For example, the first page is a high page and the second page written to the same word line is referred to as a low page. The first word line of memory blocks 30, 40, 50, 60, 70, 80, 90, and 100 includes high page P1 and low page P3. The second word line of memory blocks 30, 40, 50, 60, 70, 80, 90, and 100 includes high page P2 and low page P5. The third word line of memory blocks 30, 40, 50, 60, 70, 80, 90, and 100 includes high page P4 and low page P7. The fourth word line of memory blocks 30, 40, 50, 60, 70, 80, 90, and 100 includes high page P6 and low page P9. The fifth word line of memory blocks 30, 40, 50, 60, 70, 80, 90, and 100 includes high page P8 and a low page (unnamed). In order to simplify illustration, memory blocks 30, 40, 50, 60, 70, 80, 90, and 100 only illustrate part of memory pages.

Figure 3:
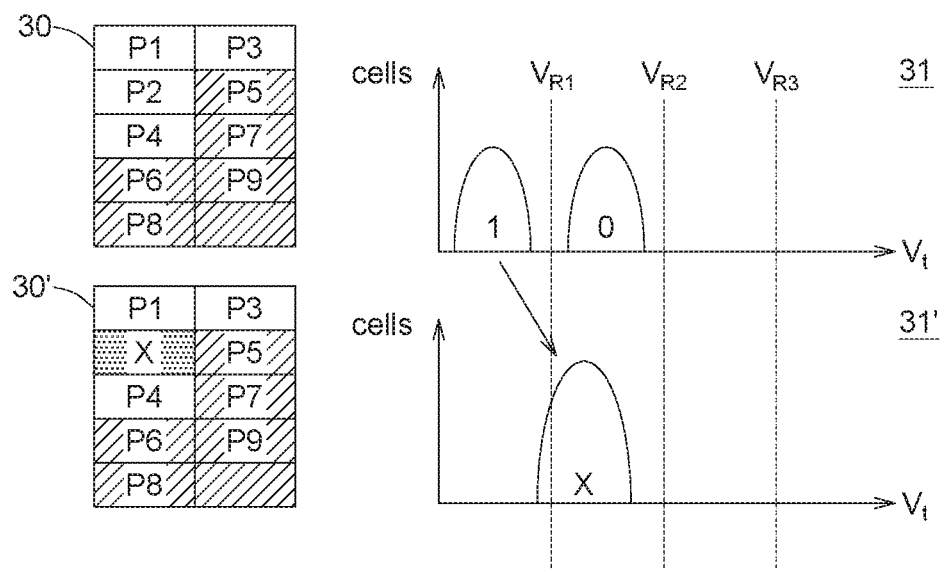
FIGS. 3 to 10 show diagrams illustrating sanitization for multi-level cells (MLC) according to embodiments of this disclosure.

Please refer to FIG. 3. In this embodiment, memory block 30 is a memory block before performing a sanitization on the memory block and memory block 30' is the memory block after performing the sanitization, i.e. memory block 30' presents sanitized memory block 30. High page P1, high page P2, low page P3, and high page P4 of memory block 30 have been programmed with data, and low page P5, high page P6, low page P7, high page P8, and low page P9 of memory block 30 have not been programmed.

Distribution 31 in FIG. 3 presents that high page P2 of the second word line has been programmed with data, and low page P5 of the same word line has not been programmed. When high page P2 would be sanitized, the sanitizer 104 applies a first reading voltage $V_{R1}$ to obtain a target memory cell of the memory cells in high page P2 having the first logical state ("1"). Then, the sanitizer 104 applies a shot to change the logical state of the target memory cell of the memory cells from the first logical state ("1") to the second logical state ("0"). Because the target memory cell is applied a shot, the target memory cell is programmed forward to the logical state with higher threshold voltage, i.e. the distribution is shifted right and higher than the first reading voltage $V_{R1}$.

Distribution 31' in FIG. 3 presents the distribution of the memory cell of high page P2 of the second word line when high page P2 of the second word line has been sanitized and low page P5 of the same word line has not been programmed. There is not a clear differentiation between the logical state (threshold voltage ($V_t$) state) of the target memory which had the first logical state and the logical state of the memory cell having the second logical state. The data of the target memory cell which had the first logical state cannot be read by applying the first reading voltage $V_{R1}$. Thus, the purpose of "deleting" data written (programmed) into high page P2 is achieved by changing the logical state of the target memory cell of high page P2. Memory block 30' presents the memory block after high page P2 has been sanitized. An X appears on the position of high page P2 to present that the data of high page P2 cannot be read correctly. Reading the data of high page P2 incorrectly could be deemed as deleting the data of high page P2.

Figure 4:
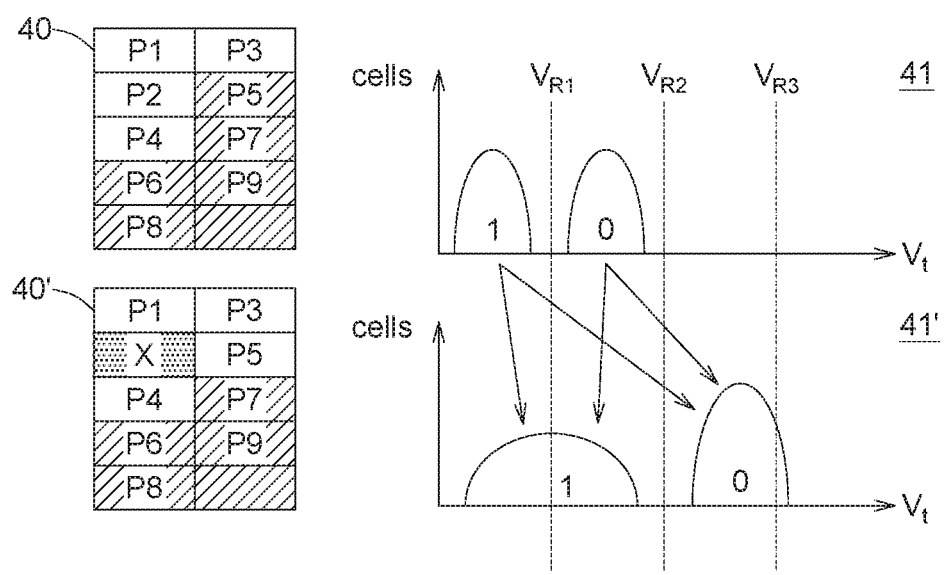

Please refer to FIG. 4. In this embodiment, memory block 40 is a memory block before performing a sanitization on the memory block and memory block 40' is the memory block after performing the sanitization, i.e. memory block 40' presents sanitized memory block 40. High page P1, high page P2, low page P3, and high page P4 of memory block 40 have been programmed with data, and low page P5, high page P6, low page P7, high page P8, and low page P9 of memory block 40 have not been programmed.

Distribution 41 in FIG. 4 presents that high page P2 of the second word line has been programmed with data, and low page P5 of the same word line has not been programmed. When high page P2 would be sanitized and low page P5 would be programmed at the same time, the sanitizer 104 applies a programming voltage, by Incremental Step Pulse Programming (ISPP), to the memory cells having the first logical state and the second logical state to program target memory cells of the memory cells having the first logical state and the second logical state which should be programmed as "0" in low page to a logical state higher a second reading voltage $V_{R2}$ according to data to be written into low page P5.

For high page P2, memory cells which had the first logical state are programmed to a logical state with higher threshold voltage which is greater than a first reading voltage $V_{R1}$. The data of high page is changed from 1 to 0, and the data cannot be correctly read by applying the first reading voltage $V_{R1}$. In addition, for low page P5, the low page is programmed at the same time when applying the programming voltage by ISPP. The logical state of the memory cells which should be programmed as 0 in low page are programmed to the third logical state. Thus, the data of low page could be read by applying a second reading voltage $V_{R2}$. The data written into high page P2 could be "deleted" and low page P5 could be programmed with data by applying the programming voltage at the same time.

Distribution 41' in FIG. 4 presents the distribution of the memory cell of low page P5 of the second word line after high page P2 of the second word line has been sanitized and low page P5 of the same word line has been programmed. Memory block 40' presents the memory block after high page P2 has been sanitized and low page P5 has been programmed. An X appears on the position of high page P2 to present that the data of high page P2 cannot be read correctly. Reading the data of high page P2 incorrectly could be deemed as deleting the data of high page P2.

In this embodiment, after high page P2 is sanitized and low page P5 is programmed as the same time, the data of low page P5 could be read by merely applying the second reading voltage $V_{R2}$. Compared to conventional way with applying the first reading voltage $V_{R1}$ and a third reading voltage $V_{R3}$ to read the data of low page P5, the present invention improves the reading performance of the memory. The second reading voltage $V_{R2}$ is greater than the first reading voltage $V_{R1}$.

Figure 5:
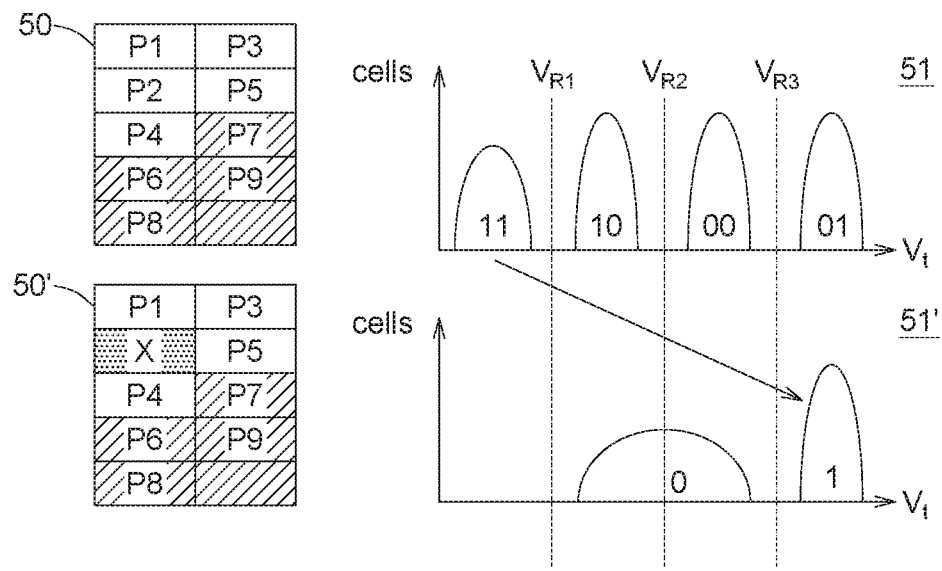

Please refer to FIG. 5. In this embodiment, memory block 50 is a memory block before performing a sanitization on the memory block and memory block 50' is the memory block after performing the sanitization, i.e. memory block 50' presents sanitized memory block 50. High page P1, high page P2, low page P3, high page P4, and low page P5 of memory block 50 have been programmed with data, and high page P6, low page P7, high page P8, and low page P9 of memory block 50 have not been programmed.

Distribution 51 of FIG. 5 presents that high page P2 of the second word line has been programmed with data, and low page of the same word line has been programmed as well. When high page P2 would be sanitized but the data of low page P5 would be kept, the sanitizer 104 applies a first reading voltage $V_{R1}$ to obtain a target memory cell of the memory cells in high page P2 having the first logical state ("11"). Then, the sanitizer 104 applies a programming voltage, by Incremental Step Pulse Programming (ISPP), to change the logical state of the target memory cell of the memory cells from the first logical state ("11") to the fourth logical state ("01").

For high page P2, the target memory cell which had the first logical state is programmed to a logical state with higher threshold voltage. The data of the target memory cell is changed from 1 to 0, and the logical state (threshold voltage state) of the target memory cell is higher than a second reading voltage $V_{R2}$. The data of the target memory cell of high page P2 cannot be correctly read by applying the second reading voltage $V_{R2}$. However, for low page P5, the data of the memory cells of low page P5 is still 1 and not changed. A third reading voltage $V_{R3}$ could be applied to read the data of the memory cells of low page P5. Thus, the data written into high page P2 could be "deleted" and the data of low page P5 could be kept. The third reading voltage $V_{R3}$ is greater than the second reading voltage $V_{R2}$, and the second reading voltage $V_{R2}$ is greater than the first reading voltage $V_{R1}$.

Distribution 51' in FIG. 5 presents the distribution of the memory cell of low page P5 of the second word line after high page P2 of the second word line has been sanitized and the data of low page P5 of the same word line has been kept. Memory block 50' presents the memory block after high page P2 has been sanitized and the data of low page P5 has been kept. An X appears on the position of high page P2 to present that the data of high page P2 cannot be read correctly. Reading the data of high page P2 incorrectly could be deemed as deleting the data of high page P2.

In this embodiment, after high page P2 is sanitized, the data of low page P5 could be read by merely applying the third reading voltage $V_{R3}$. Compared to conventional way with applying the first reading voltage $V_{R1}$ and the third reading voltage $V_{R3}$ to read the data of low page P5, the present invention improves the reading performance of the memory.

Figure 6:
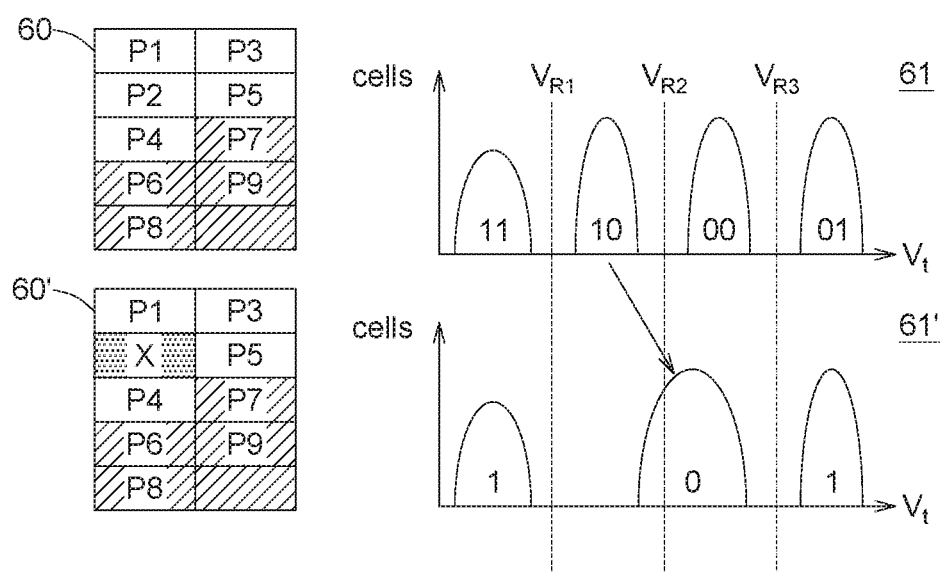

Please refer to FIG. 6. In this embodiment, memory block 60 is a memory block before performing a sanitization on the memory block and memory block 60' is the memory block after performing the sanitization, i.e. memory block 60' presents sanitized memory block 60. High page P1, high page P2, low page P3, high page P4, and low page P5 of memory block 60 have been programmed with data, and high page P6, low page P7, high page P8, and low page P9 of memory block 60 have not been programmed.

Distribution 61 in FIG. 6 presents that high page P2 of the second word line has been programmed with data, and low page of the same word line has been programmed as well. This embodiment illustrates another approach that high page P2 would be sanitized but the data of low page P5 would be kept. In this embodiment, the sanitizer 104 applies a first reading voltage $V_{R1}$ and a second reading voltage $V_{R2}$ to obtain the target memory cell of the memory cells having the second logical state ("10"). Then, the sanitizer 104 applies a shot to change the logical state of the target memory cell of the memory cells from the second logical state ("10") to the third logical state ("00"), and the changed logical state of the target memory cell is higher than the second reading voltage $V_{R2}$. The second reading voltage $V_{R2}$ is greater than the first reading voltage $V_{R1}$.

For high page P2, the target memory cell which had the second logical state is programmed to a logical state with higher threshold voltage which is greater than the second reading voltage $V_{R2}$. The data of the target memory cell of high page P2 is changed from 1 to 0, and the data of the target memory cell of high page P2 cannot be correctly read by applying the second reading voltage $V_{R2}$. However, for low page P5, the data of the memory cells of low page P5 is still 0 and not changed. The first reading voltage $V_{R1}$ and a third reading voltage $V_{R3}$ could be applied to read the data of the memory cells of low page P5. Thus, the data written into high page P2 could be "deleted" and the data of low page P5 could be kept.

Distribution 61' in FIG. 6 presents the distribution of the memory cell of low page P5 of the second word line after high page P2 of the second word line has been sanitized and the data of low page P5 of the same word line has been kept. Memory block 60' presents the memory block after high page P2 has been sanitized and the data of low page P5 has been kept. An X appears on the position of high page P2 to present that the data of high page P2 cannot be read correctly. Reading the data of high page P2 incorrectly could be deemed as deleting the data of high page P2.

Figure 7:
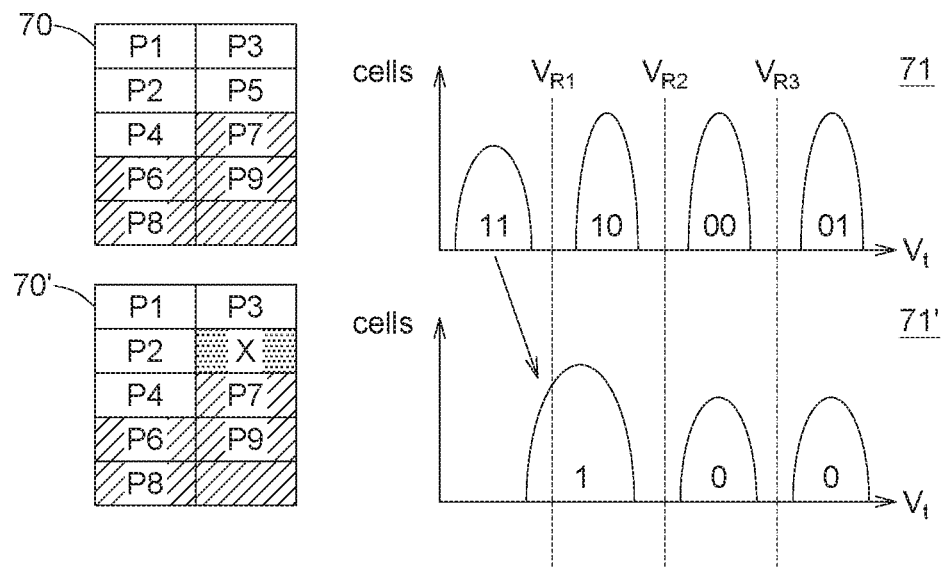

Please refer to FIG. 7. In this embodiment, memory block 70 is a memory block before performing a sanitization on the memory block and memory block 70' is the memory block after performing the sanitization, i.e. memory block 70' presents sanitized memory block 70. High page P1, high page P2, low page P3, high page P4, and low page P5 of memory block 70 have been programmed with data, and high page P6, low page P7, high page P8, and low page P9 of memory block 70 have not been programmed.

Distribution 71 in FIG. 7 presents that high page P2 of the second word line has been programmed with data, and low page of the same word line has been programmed as well. When low page P5 would be sanitized but the data of high page P2 would be kept, the sanitizer 104 applies a first reading voltage $V_{R1}$ to obtain the target memory cell of the memory cells having the first logical state ("11"). Then, the sanitizer 104 applies a shot to change the logical state of the target memory cell of the memory cells from the first logical state ("11") to the second logical state ("10"), and the changed logical state of the target memory cell is higher than the first reading voltage $V_{R1}$.

For low page P5, the target memory cell which had the first logical state is programmed to a logical state with higher threshold voltage which is greater than the first reading voltage $V_{R1}$. The data of the target memory cell of low page P5 is changed from 1 to 0, and the data of the target memory cell of low page P5 cannot be correctly read by applying the first reading voltage $V_{R1}$. However, for high page P2, the data of the memory cells of high page P2 is still 1 and not changed. A second reading voltage $V_{R2}$ could be applied to read the data of the memory cells of high page P2. Thus, the data written into low page P5 could be "deleted" and the data of high page P2 could be kept. The second reading voltage $V_{R2}$ is greater than the first reading voltage $V_{R1}$.

Distribution 71' in FIG. 7 presents the distribution of the memory cell of high page P2 of the second word line after low page P5 of the second word line has been sanitized and the data of high page P2 of the same word line has been kept. Memory block 70' presents the memory block after low page P5 has been sanitized and the data of high page P2 has been kept. An X appears on the position of low page P5 to present that the data of low page P5 cannot be read correctly. Reading the data of low page P5 incorrectly could be deemed as deleting the data of low page P5.

Figure 8:
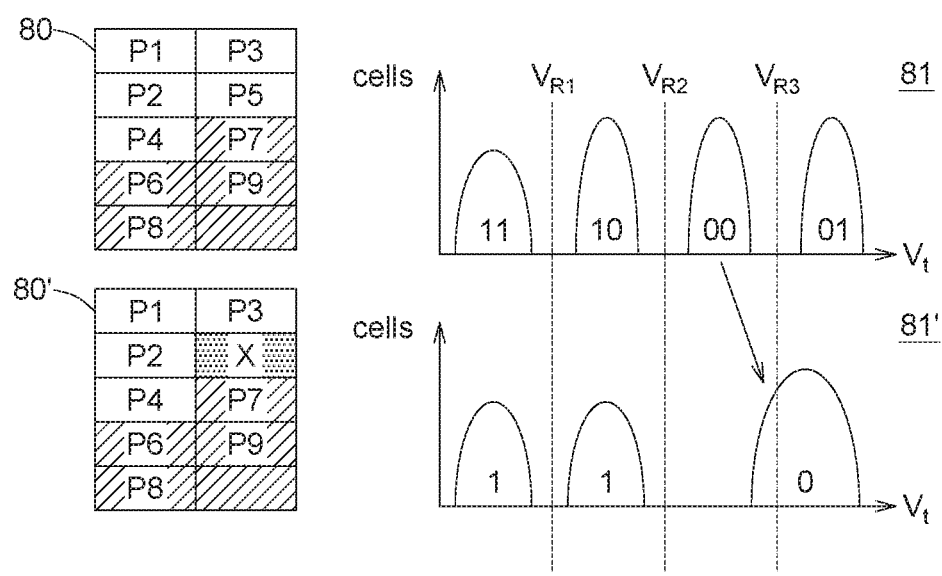

Please refer to FIG. 8. In this embodiment, memory block 80 is a memory block before performing a sanitization on the memory block and memory block 80' is the memory block after performing the sanitization, i.e. memory block 80' presents sanitized memory block 80. High page P1, high page P2, low page P3, high page P4, and low page P5 of memory block 80 have been programmed with data, and high page P6, low page P7, high page P8, and low page P9 of memory block 80 have not been programmed.

Distribution 81 of FIG. 8 presents that high page P2 of the second word line has been programmed with data, and low page of the same word line has been programmed as well. When low page P5 would be sanitized but the data of high page P2 would be kept, the sanitizer 104 applies a second reading voltage $V_{R2}$ and a third reading voltage $V_{R3}$ to obtain a target memory cell of the memory cells having the third logical state ("00"). Then, the sanitizer 104 applies a shot to change the logical state of the target memory cell of the memory cells from the third logical state ("00") to the fourth logical state ("01"), and the changed logical state of the target memory cell is higher than the third reading voltage $V_{R3}$. The third reading voltage $V_{R3}$ is greater than the second reading voltage $V_{R2}$.

For low page P5, the target memory cell which had the third logical state is programmed to a logical state with higher threshold voltage which is greater than the third reading voltage $V_{R3}$. The data of the target memory cell of low page P5 is changed from 0 to 1, and the data of the target memory cell of low page P5 cannot be correctly read by applying the third reading voltage $V_{R3}$. However, for high page P2, the data of the memory cells of high page P2 is still 0 and not changed. The second reading voltage $V_{R2}$ could be still applied to read the data of the memory cells of high page P2. Thus, the data written into low page P5 could be "deleted" and the data of high page P2 could be kept.

Distribution 81' in FIG. 8 presents the distribution of the memory cell of high page P2 of the second word line after low page P5 of the second word line has been sanitized and the data of high page P2 of the same word line has been kept. Memory block 80' presents the memory block after low page P5 has been sanitized and the data of high page P2 has been kept. An X appears on the position of low page P5 to present that the data of low page P5 cannot be read correctly. Reading the data of low page P5 incorrectly could be deemed as deleting the data of low page P5.

Figure 9:
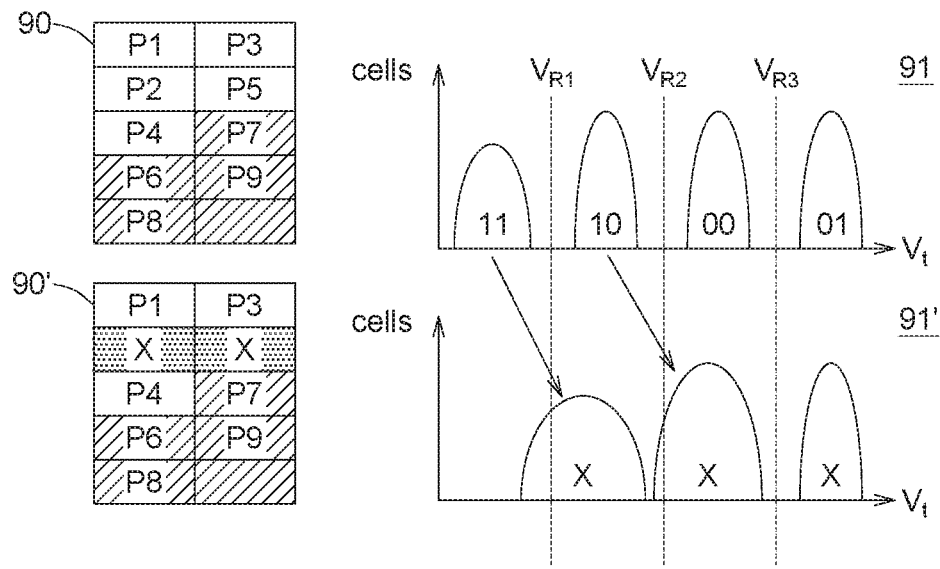

Please refer to FIG. 9. In this embodiment, memory block 90 is a memory block before performing a sanitization on the memory block and memory block 90' is the memory block after performing the sanitization, i.e. memory block 90' presents sanitized memory block 90. High page P1, high page P2, low page P3, high page P4, and low page P5 of memory block 90 have been programmed with data, and high page P6, low page P7, high page P8, and low page P9 of memory block 90 have not been programmed.

Distribution 91 of FIG. 9 presents that high page P2 of the second word line has been programmed with data, and low page of the same word line has been programmed as well. When both of high page P2 and low page P5 would be sanitized, the sanitizer 104 applies a second reading voltage $V_{R2}$ to obtain a first target memory cell of the memory cells having the first logical state ("11") and a second target memory cell of the memory cells having the second logical state ("10"). Then, the sanitizer 104 applies a shot to change the logical state of the first target memory cell of the memory cells from the first logical state ("11") to the second logical state ("10") and the logical state of the second target memory cell of the memory cells from the second logical state ("10") to the third logical state ("00"). The changed logical state of the first target memory cell is higher than the first reading voltage $V_{R1}$ and the changed logical state of the second target memory cell is higher than the second reading voltage $V_{R2}$. The second reading voltage $V_{R2}$ is greater than the first reading voltage $V_{R1}$.

For low page P5, the target memory cell which had the first logical state is programmed to a logical state with higher threshold voltage which is greater than the first reading voltage $V_{R1}$. The data of the target memory cell of low page P5 is changed from 1 to 0, and the data of the target memory cell of low page P5 cannot be correctly read by applying the first reading voltage $V_{R1}$. For high page P2, the target memory cell which had the second logical state is programmed to a logical state with higher threshold voltage which is greater than the second reading voltage $V_{R2}$. The data of the target memory cell of high page P2 is changed from 1 to 0, and the data of the target memory cell of high page P2 cannot be correctly read by applying the second reading voltage $V_{R2}$. Thus, the data written into high page P2 and low page P5 could be "deleted'.

Distribution 91' in FIG. 9 presents the distribution of the memory cell of the second word line after high page P2 and low page P5 of the second word line have been sanitized. Memory block 90' presents the memory block after high page P2 and low page P5 have been sanitized. Two Xs respectively appears on the positions of high page P2 and low page P5 to present that the data of high page P2 and the data of low page P5 cannot be read correctly. Reading the data of high page P2 and the data of low page P5 incorrectly could be deemed as deleting the data of high page P2 and the data of low page P5.

Figure 10:
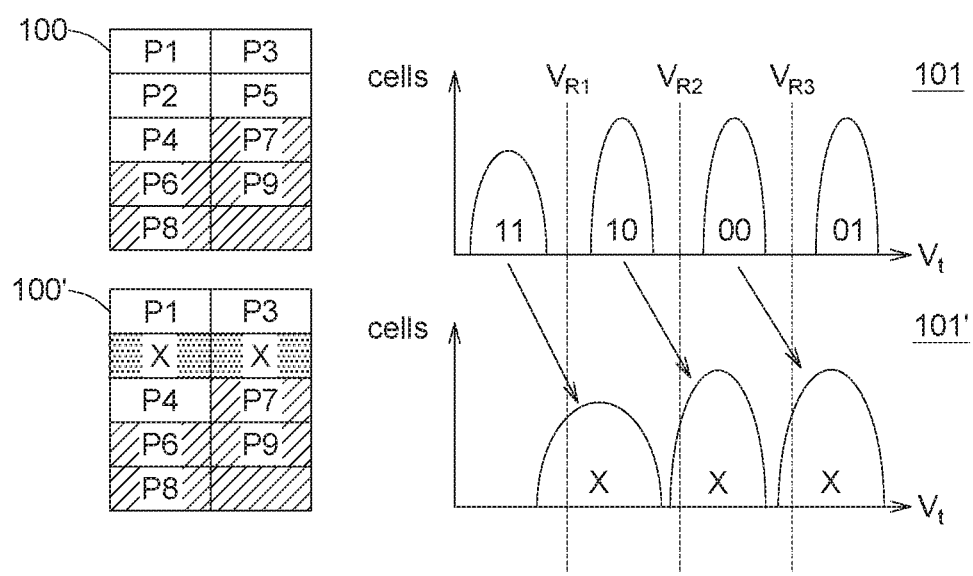

Please refer to FIG. 10. In this embodiment, memory block 100 is a memory block before performing a sanitization on the memory block and memory block 100' is the memory block after performing the sanitization, i.e. memory block 100' presents sanitized memory block 100. High page P1, high page P2, low page P3, high page P4, and low page P5 of memory block 100 have been programmed with data, and high page P6, low page P7, high page P8, and low page P9 of memory block 100 have not been programmed.

Distribution 101 of FIG. 10 presents that high page P2 of the second word line has been programmed with data, and low page of the same word line has been programmed as well. This embodiment illustrates another approach that both of high page P2 and low page P5 would be sanitized. In this embodiment, the sanitizer 104 applies a third reading voltage $V_{R3}$ to obtain the a first target memory cell of the memory cells having the first logical state ("11"), a second target memory cell of the memory cells having the second logical state ("10") and a third target memory cell of the memory cells having the third logical state ("00"). Then, the sanitizer 104 applies a shot to change the logical state of the first target memory cell of the memory cells from the first logical state ("11") to the second logical state ("10"), the logical state of the second target memory cell of the memory cells from the second logical state ("10") to the third logical state ("00"), and the logical state of the third target memory cell of the memory cells from the third logical state ("00") to the fourth logical state ("01").

For low page P5, the first target memory cell which had the first logical state is programmed to a logical state with higher threshold voltage which is greater than a first reading voltage $V_{R1}$. The data of the first target memory cell of low page P5 is changed from 1 to 0, and the data of the first target memory cell of low page P5 cannot be correctly read by applying the first reading voltage $V_{R1}$. The third target memory cell which had the third logical state is programmed to a logical state with higher threshold voltage which is greater than the third reading voltage $V_{R3}$. The data of the third target memory cell of low page P5 is changed from 0 to 1, and the data of the third target memory cell of low page P5 cannot be correctly read by applying the third reading voltage $V_{R3}$. For high page P2, the second target memory cell which had the second logical state is programmed to a logical state with higher threshold voltage which is greater than a second reading voltage $V_{R2}$. The data of the second target memory cell of high page P2 is changed from 1 to 0, and the data of the second target memory cell of high page P2 cannot be correctly read by applying the second reading voltage $V_{R2}$. Thus, the data written into high page P2 and low page P5 could be "deleted'. The third reading voltage $V_{R3}$ is greater than the second reading voltage $V_{R2}$, and the second reading voltage $V_{R2}$ is greater than the first reading voltage $V_{R1}$.

Distribution 101' in FIG. 10 presents the distribution of the memory cell of the second word line after high page P2 and low page P5 of the second word line have been sanitized. The data corresponding to the threshold voltage states marked "X" cannot be read correctly. Memory block 100' presents the memory block after high page P2 and low page P5 have been sanitized. High page P2 and low page P5 are marked "X" to present that the data of high page P2 and the data of low page P5 cannot be read correctly. Reading the data of high page P2 and the data of low page P5 incorrectly could be deemed as deleting the data of high page P2 and the data of low page P5.

Figure 11:
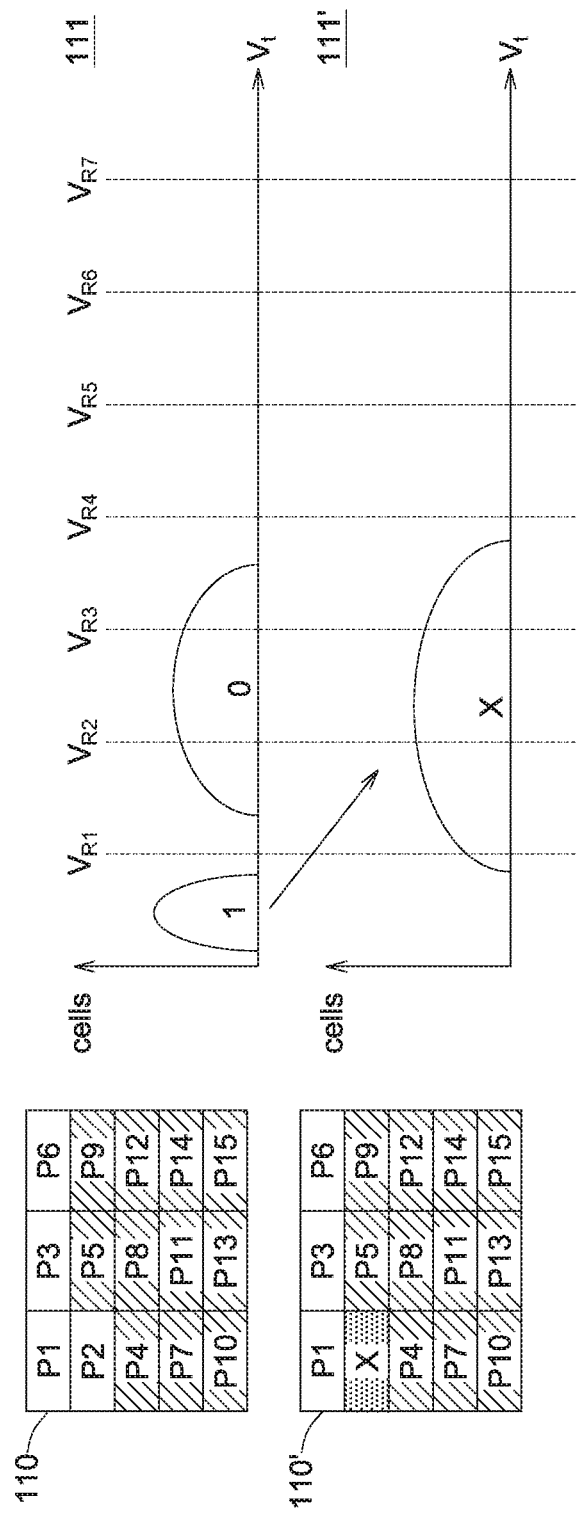
FIGS. 11 to 13 show diagrams illustrating sanitization for triple-level cells (TLC) according to embodiments of this disclosure.
Figure 12:
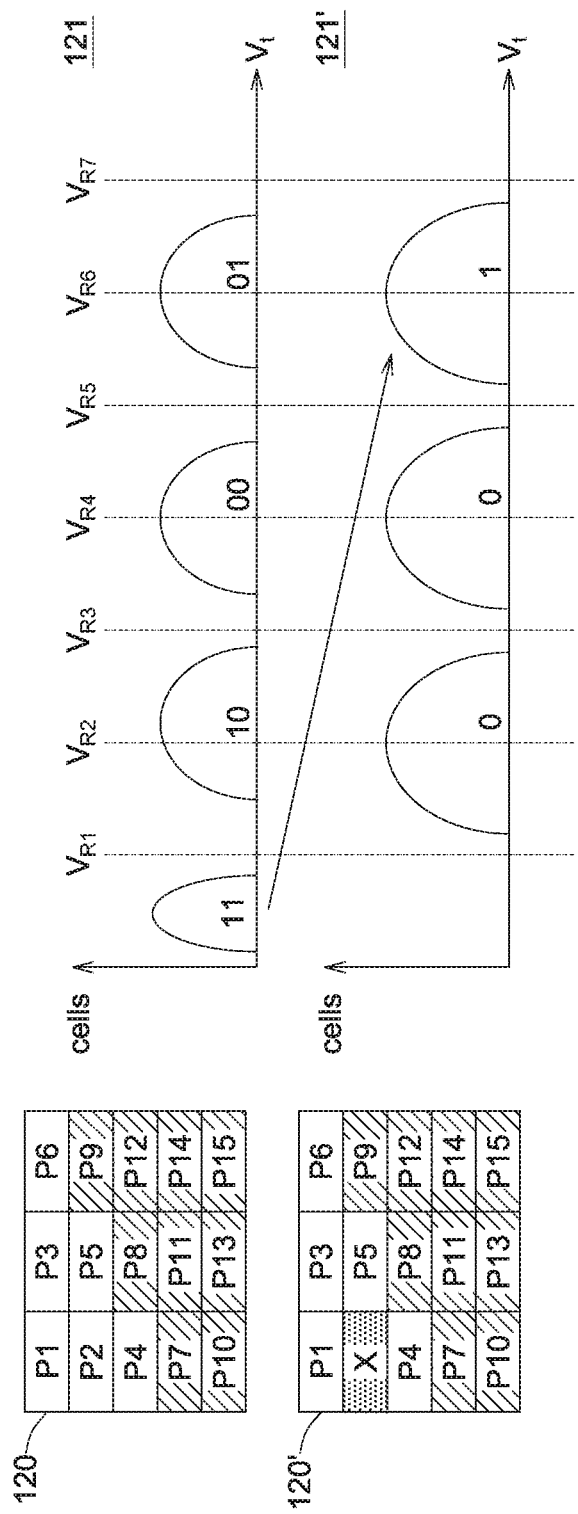
Figure 13:
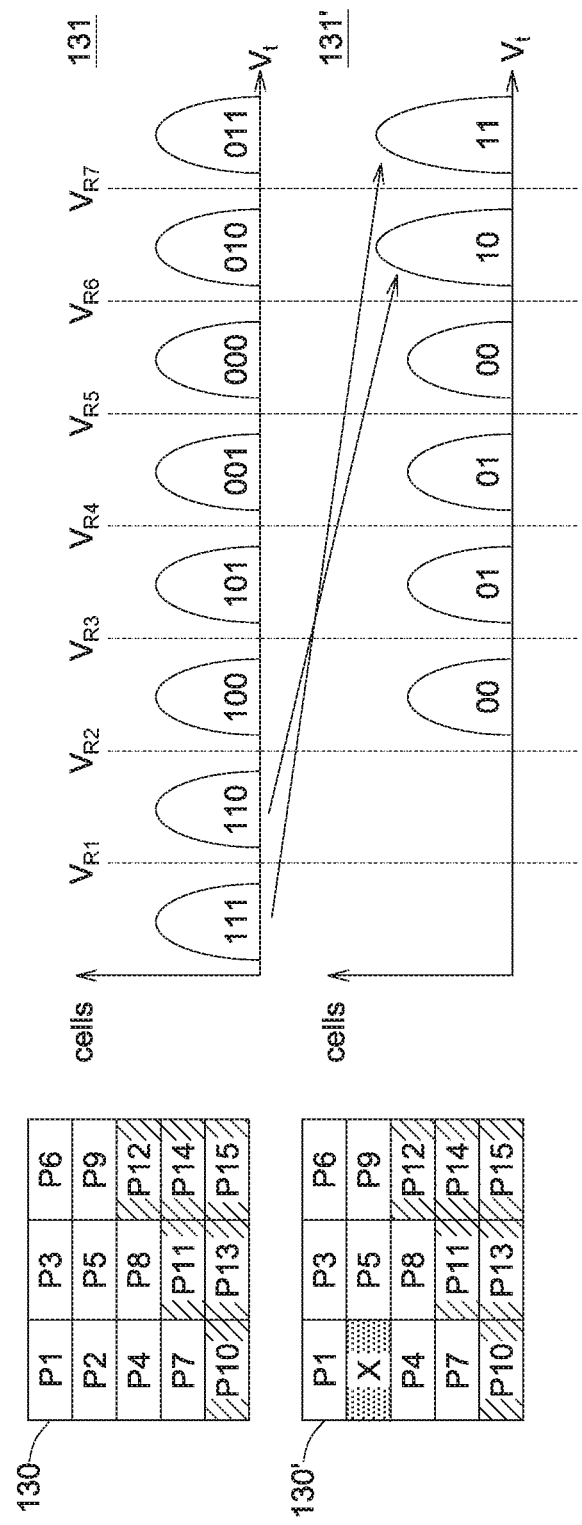

Please refer to FIGS. 11 to 13. FIGS. 11 to 13 show diagrams illustrating sanitization for triple-level cells (TLC) according to embodiments of this disclosure. FIGS. 11 to 13 further illustrate how the logical state of the target memory cell of the target memory block is changed by applying the sanitizing voltage.

Memory blocks 110, 120 and 130 in FIGS. 11 to 13 have the same configuration. Each of memory blocks 110, 120 and 130 includes a plurality of word lines, and a word line includes a first page, a second page, and a third page. A page could include more than one memory cells. The memory cell of each of memory blocks 110, 120 and 130 is a triple-level cell including a first storage bit, a second storage bit and a third storage bit to store three bits. Storing the data of three pages in a word line is equivalent to storing three-bit data in each cell of the same word line. Each of the memory cells has a first logical state, a second logical state, a third logical state, a fourth logical state, a fifth logical state, a sixth logical state, a seventh logical state, and a eighth logical state. For example, the first logical state is "111", the second logical state is "110", the third logical state is "100", the fourth logical state is "101", the fifth logical state is "001", the sixth logical state is "000", the seventh logical state is "010", and the eighth logical state is "011", For example, the first page is a high page, the second page is a mid-page and the third page written to the same word line is referred to as a low page. The first word line of memory blocks 110, 120 and 130 includes high page P1, mid-page P3 and low page P6. The second word line of memory blocks 110, 120 and 130 includes high page P2, mid-page P5 and low page P9. The third word line of memory blocks 110, 120 and 130 includes high page P4, mid-page P8 and low page P12. The fourth word line of memory blocks 110, 120 and 130 includes high page P7, mid-page P11 and low page P14. The fifth word line of memory blocks 110, 120 and 130 includes high page P10, mid-page P13 and low page P15. In order to simplify illustration, memory blocks 110, 120 and 130 only illustrate parts of memory pages.

Please refer to FIG. 11. In this embodiment, memory block 110 is a memory block before performing a sanitization on the memory block and memory block 110' is the memory block after performing the sanitization, i.e. memory block 110' presents sanitized memory block 110. High page P1, mid-page P3, low page P6 and high page P2 of memory block 110 have been programmed with data, and mid-page P5, low page P9, high page P4, mid-page P8, low page P12, high page P7, mid-page P11, low page P14, high page P10, mid-page P13, and low page P15 of memory block 110 have not been programmed.

Distribution 111 in FIG. 11 presents that high page P2 of the second word line has been programmed with data, and mid-page P5 and low page P9 of the same word line have not been programmed. When high page P2 would be sanitized, the sanitizer 104 applies a first reading voltage $V_{R1}$ to obtain a target memory cell of the memory cells in high page P2 having the first logical state ("1"). Then, the sanitizer 104 applies a shot to change the logical state of the target memory cell of the memory cells from the first logical state ("1") to the second logical state ("0"). Because the target memory cell is applied a shot, the target memory cell is programmed forward to the logical state with higher threshold voltage, i.e. the distribution is shifted right and higher than the first reading voltage $V_{R1}$.

Distribution 111' in FIG. 11 presents the distribution of the memory cell of high page P2 of the second word line when high page P2 of the second word line has been sanitized, and mid-page P5 and low page P9 of the same word line have not been programmed. The data corresponding to the threshold voltage states marked "X" cannot be read correctly. There is not a clear differentiation between the logical state (threshold voltage ($V_t$) state) of the target memory which had the first logical state and the logical state of the memory cell having the second logical state. The data of the target memory cell which had the first logical state cannot be read by applying the first reading voltage $V_{R1}$. Thus, the purpose of "deleting" data written (programmed) into high page P2 is achieved by changing the logical state of the target memory cell of high page P2. Memory block 110' presents the memory block after high page P2 has been sanitized. An X appears on the position of high page P2 to present that the data of high page P2 cannot be read correctly. Reading the data of high page P2 incorrectly could be deemed as deleting the data of high page P2.

Please refer to FIG. 12. In this embodiment, memory block 120 is a memory block before performing a sanitization on the memory block and memory block 120' is the memory block after performing the sanitization, i.e. memory block 120' presents sanitized memory block 120. High page P1, mid-page P3, low page P6, high page P2, mid-page P5, and high page P4 of memory block 120 have been programmed with data, and low page P9, mid-page P8, low page P12, high page P7, mid-page P11, low page P14, high page P10, mid-page P13, and low page P15 of memory block 120 have not been programmed.

Distribution 121 in FIG. 12 presents that high page P2 and mid-page P5 of the second word line have been programmed with data, and low page P9 of the same word line has not been programmed. When high page P2 would be sanitized but the data of mid-page P5 would be kept, the sanitizer 104 applies a first reading voltage $V_{R1}$ to obtain a target memory cell of the memory cells having the first logical state ("11"). Then, the sanitizer 104 applies a programming voltage, by Incremental Step Pulse Programming (ISPP), to change the logical state of the target memory cell of the memory cells from the first logical state ("11") to the fifth logical state. In addition, when reading page P5, only reading voltage $V_{R5}$ is applied to read the data of page P5. The performance could be improved in reading data stored in memory pages.

For high page P2, the target memory cell which had the first logical state is programmed to a logical state with higher threshold voltage which is greater than the first reading voltage $V_{R1}$. The data of the target memory cell is changed from 1 to 0, and the data of the target memory cell of high page P2 cannot be correctly read by applying the first reading voltage $V_{R1}$. However, for mid-page P5, the data of the memory cells of mid-page P5 is still 1 and not changed. A fifth reading voltage $V_{R5}$ could be applied to read the data of the memory cells of mid-page P5. Thus, the data written into high page P2 could be "deleted" and the data of mid-page P5 could be kept. In addition, when reading mid-page P5, only the fifth reading voltage $V_{R5}$ is applied to read the data of the memory cells of mid-page P5, the performance of reading pages is increased.

Distribution 121' in FIG. 12 presents the distribution of the memory cell of mid-page P5 of the second word line after high page P2 of the second word line has been sanitized and the data of mid-page P5 of the same word line has been kept. Memory block 120' presents the memory block after high page P2 has been sanitized and the data of mid-page P5 has been kept. An X appears on the position of high page P2 to present that the data of high page P2 cannot be read correctly. Reading the data of high page P2 incorrectly could be deemed as deleting the data of high page P2.

In this embodiment, after high page P2 is sanitized, the data of mid-page P5 could be read by merely applying the fifth reading voltage $V_{R5}$. Compared to conventional way with applying the first reading voltage $V_{R1}$ and the fifth reading voltage $V_{R5}$ to read the data of mid-page P5, the present invention improves the reading performance of the memory. The fifth reading voltage $V_{R5}$ is greater than the first reading voltage $V_{R1}$.

Please refer to FIG. 13. In this embodiment, memory block 130 is a memory block before performing a sanitization on the memory block and memory block 130' is the memory block after performing the sanitization, i.e. memory block 130' presents sanitized memory block 130. High page P1, mid-page P3, low page P6, high page P2, mid-page P5, high page P4, mid-page P8, and high page P7 of memory block 130 have been programmed with data, and low page P9, low page P12, mid-page P11, low page P14, high page P10, mid-page P13, and low page P15 of memory block 130 have not been programmed.

Distribution 131 of FIG. 13 presents that high page P2, mid-page P5 and low page P9 of the second word line have been programmed with data. When high page P2 would be sanitized but the data of mid-page P5 and the data of low page P9 would be kept, the sanitizer 104 applies a first reading voltage $V_{R1}$ and a second reading voltage $V_{R2}$ to obtain a first target memory cell of the memory cells having the first logical state ("111") and a second target memory cell of the memory cells having the second logical state ("110"). Then, the sanitizer 104 applies a programming voltage, by full sequence programming, to change the logical state of the first target memory cell of the memory cells from the first logical state ("111") to the eighth logical state and the logical state of the second target memory cell of the memory cells from the second logical state ("110") to the seventh logical state. The second reading voltage $V_{R2}$ is greater than the first reading voltage $V_{R1}$.

For high page P2, the first target memory cell which had the first logical state is programmed to a logical state with higher threshold voltage which is greater than a fourth reading voltage $V_{R4}$. The data of the first target memory cell is changed from 1 to 0, and the data of the first target memory cell of high page P2 cannot be correctly read by applying the fourth reading voltage $V_{R4}$. However, for mid-page P5, the data of the memory cells of mid-page P5 is still 1 and not changed. A sixth reading voltage $V_{R6}$ could be applied to read the data of the memory cells of mid-page P5. In addition, for low page P9, the data of the memory cells of low page P9 having the first logical state is still 1 and the data of the memory cells of low page P9 having the second logical state is still 0. The data of the memory cells of low page P9 is not changed. A third reading voltage $V_{R3}$, a fifth reading voltage $V_{R5}$ and a seventh reading voltage $V_{R7}$ could be applied to read the data of the memory cells of low page P9. Thus, the data written into high page P2 could be "deleted" and the data of mid-page P5 and the data of low page P9 could be kept. The seventh reading voltage $V_{R7}$ is greater than the sixth reading voltage $V_{R6}$, and the sixth reading voltage $V_{R6}$ is greater than the fifth reading voltage $V_{R5}$. The fifth reading voltage $V_{R5}$ is greater than the fourth reading voltage $V_{R4}$ and the fourth reading voltage $V_{R4}$ is greater than the third reading voltage $V_{R3}$. The third reading voltage $V_{R3}$ is greater than the third reading voltage $V_{R3}$. In addition, the performance could be improved in reading pages P5 and P9.

Distribution 131' in FIG. 13 presents the distribution of the memory cells of mid-page P5 and low page P9 of the second word line after high page P2 of the second word line has been sanitized and the data of mid-page P5 and the data of low page P9 have been kept. Memory block 130' presents the memory block after high page P2 has been sanitized and the data of mid-page P5 and the data of low page P9 have been kept. An X appears on the position of high page P2 to present that the data of high page P2 cannot be read correctly. Reading the data of high page P2 incorrectly could be deemed as deleting the data of high page P2.

The operations of applying the sanitizing voltage to triple-level cells are not limited to the above illustrated embodiments. A person having ordinary knowledge in the art should understand all kinds of operations of applying the sanitizing voltage to triple-level cells according to the above illustrated embodiments. It will be apparent that the present invention is not only applied to MLC and TLC, but also a memory in which each memory cell stores four or more bits.

According to embodiments of the present invention, a shot or a programming voltage, by ISPP or full sequence programming, could be applied to memory cells of memory pages of memory blocks to change the logical states of the memory cells, program the logical states of the memory cells and change the data stored in the memory cells. Thus, the data of the memory cells is not read correctly, and the purpose of "deleting" data is achieved. In addition, the present invention could improve the data security of memory and prevent hackers from rebuilding data by obtaining data copies. The operation of "deleting" data for a particular page could be performed in the present invention. The user does not need to perform garbage collection and erase operations on the memory blocks which have particular pages storing data copies. The number of erasing memory blocks could be decreased and lifetime of the memory could be increased. When reading pages, the number of applying reading voltages could be reduced, and thus the performance of the memory could be improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data management method for a memory, the memory including a plurality of memory pages, each of the memory pages including a plurality of memory cells, each of the memory cells including a first storage bit and a second storage bit, each of the memory cells having a first logical state, a second logical state, a third logical state, and a fourth logical state, the data management method comprising:
   receiving, by a sanitizer, a data update command corresponding to a logical address, the logical address mapping to a physical address before receiving the data update command;
   obtaining a first target memory cell of the memory cells in a target memory page of the memory pages located at the physical address; and
   applying, by the sanitizer, a sanitizing voltage to the first target memory cell of the memory cells in the target memory page of the memory pages located at the physical address to change the logical state of the first target memory cell;
   wherein the step of applying the sanitizing voltage includes:
   applying, by the sanitizer, a reading voltage to obtain the first target memory cell of the memory cells having the first logical state and a second target memory cell of the memory cells having the second logical state; and
   applying, by the sanitizer, a shot to change the logical state of the first target memory cell of the memory cells from the first logical state to the second logical state and the logical state of the second target memory cell of the memory cells from the second logical state to the third logical state.

2. The data management method according to claim 1, wherein the step of applying the sanitizing voltage includes:
   applying, by the sanitizer, a first reading voltage and a second reading voltage to obtain the first target memory cell of the memory cells having the second logical state; and
   applying, by the sanitizer, the shot to change the logical state of the first target memory cell of the memory cells from the first logical state to the third logical state;
   wherein the second reading voltage is greater than the first reading voltage.

3. The method according to claim 1, wherein the step of applying the sanitizing voltage includes:
   applying, by the sanitizer, a second reading voltage and a third reading voltage to obtain the first target memory cell of the memory cells having the third logical state; and
   applying, by the sanitizer, the shot to change the logical state of the first target memory cell of the memory cells from the third logical state to the fourth logical state;
   wherein the third reading voltage is greater than the second reading voltage.

4. The method according to claim 1, wherein the step of applying the sanitizing voltage includes:
   applying, by the sanitizer, a second reading voltage to obtain the first target memory cell of the memory cells having the first logical state, a second target memory cell of the memory cells having the second logical state and a third target memory cell of the memory cells having the third logical state; and applying, by the sanitizer, the shot to change the logical state of the first target memory cell of the memory cells from the first logical state to the second logical state, the logical state of the second target memory cell of the memory cells from the second logical state to the third logical state and the logical state of the third target memory cell of the memory cells from the third logical state to the fourth logical state.

5. The method according to claim 1, wherein the step of applying the sanitizing voltage includes:

applying, by the sanitizer, a first reading voltage to obtain the first target memory cell of the memory cells having the first logical state; and applying a first programming voltage, by Incremental Step Pulse Programming (ISPP), to change the logical state of the first target memory cell of the memory cells from the first logical state to the fourth logical state.

6. The method according to claim 1, wherein the step of applying the sanitizing voltage includes:

applying, by the sanitizer, a first programming voltage, by Incremental Step Pulse Programming (ISPP), to change the logical state of the first target memory cell of the memory cells according to a data to be written.

7. A data management method for a memory, the memory including a plurality of memory pages, each of the memory pages including a plurality of memory cells, each of the memory cells including a first storage bit and a second storage bit, each of the memory cells having a first logical state, a second logical state, a third logical state, and a fourth logical state, the data management method comprising:

receiving, by a sanitizer, a data update command corresponding to a logical address, the logical address mapping to a physical address before receiving the data update command; and wherein each of the memory cells further includes a third storage bit, each of the memory cells further has a fifth logical state, a sixth logical state, a seventh logical state, and an eighth logical state, the step of applying the sanitizing voltage includes:

applying, by the sanitizer, a first reading voltage and a second reading voltage to obtain the first target memory cell of the memory cells having the first logical state and a second target memory cell of the memory cells having the second logical state; and applying, by the sanitizer, a second programming voltage, by full sequence programming, to change the logical state of the first target memory cell of the memory cells from the first logical state to the eighth logical state and the logical state of the second target memory cell of the memory cells from the second logical state to the seventh logical state;

wherein the second reading voltage is greater than the first reading voltage.

8. A memory apparatus, comprising:

a memory array, including a plurality of memory pages, each of the memory pages including a plurality of memory cells, each of the memory cells including a first storage bit and a second storage bit, each of the memory cells having a first logical state, a second logical state, a third logical state, and a fourth logical state; and a sanitizer, for receiving a data update command corresponding to a logical address, the logical address mapping to a physical address before receiving the data update command to obtain a first target memory cell of the memory cells in a target memory page of the memory pages located at the physical address, and applying a sanitizing voltage to the first target memory cell of the memory cells in the target memory page of the memory pages located at the physical address to change the logical state of the first target memory cell;

wherein the sanitizer applies a reading voltage to obtain the first target memory cell of the memory cells having the first logical state and a second target memory cell of the memory cells having the second logical state, and applies a shot to change the logical state of the first target memory cell of the memory cells from the first logical state to the second logical state and the logical state of the second target memory cell of the memory cells from the second logical state to the third logical state.

9. The memory apparatus to claim 8, wherein the sanitizer applies a first reading voltage and a second reading voltage to obtain the first target memory cell of the memory cells having the second logical state, and applies the shot to change the logical state of the first target memory cell of the memory cells from the first logical state to the third logical state, wherein the second reading voltage is greater than the first reading voltage.

10. The memory apparatus to claim 8, wherein the sanitizer applies a second reading voltage and a third reading voltage to obtain the first target memory cell of the memory cells having the third logical state, and applies the shot to change the logical state of the first target memory cell of the memory cells from the third logical state to the fourth logical state, wherein the third reading voltage is greater than the second reading voltage.

11. The memory apparatus to claim 8, wherein the sanitizer applies a third reading voltage to obtain the first target memory cell of the memory cells having the first logical state, a second target memory cell of the memory cells having the second logical state and a third target memory cell of the memory cells having the third logical state, and applies the shot to change the logical state of the first target memory cell of the memory cells from the first logical state to the second logical state, the logical state of the second target memory cell of the memory cells from the second logical state to the third logical state and the logical state of the third target memory cell of the memory cells from the third logical state to the fourth logical state.

12. The memory apparatus to claim 8, wherein the sanitizer applies a first reading voltage to obtain the first target memory cell of the memory cells having the first logical state, and applies a first programming voltage, by Incremental Step Pulse Programming (ISPP), to change the logical state of the first target memory cell of the memory cells from the first logical state to the fourth logical state.

13. The memory apparatus to claim 8, wherein the sanitizer applies a first programming voltage, by Incremental Step Pulse Programming (ISPP), to change the logical state of the first target memory cell of the memory cells according to a data to be written.

14. A memory apparatus, comprising:

a memory array, including a plurality of memory pages, each of the memory pages including a plurality of memory cells, each of the memory cells including a first storage bit and a second storage bit, each of the memory cells having a first logical state, a second logical state, a third logical state, and a fourth logical state; and a sanitizer, for receiving a data update command corresponding to a logical address, the logical address mapping to a physical address before receiving the data update command, and applying a sanitizing voltage to a first target memory cell of the memory cells in a target memory page of the memory pages located at the physical address to change the logical state of the first target memory cell;

wherein each of the memory cells further includes a third storage bit, each of the memory cells further has a fifth logical state, a sixth logical state, a seventh logical state, and an eighth logical state, the sanitizer applies a first reading voltage and a second reading voltage to obtain the first target memory cell of the memory cells having the first logical state and a second target memory cell of the memory cells having the second logical state, and applies a second programming voltage, by full sequence programming, to change the logical state of the first target memory cell of the memory cells from the first logical state to the eighth logical state and the logical state of the second target memory cell of the memory cells from the second logical state to the seventh logical state, wherein the second reading voltage is greater than the first reading voltage.

* * * * *